(12) United States Patent
Schug et al.

(10) Patent No.: US 7,806,541 B2
(45) Date of Patent: Oct. 5, 2010

(54) HIGH PERFORMANCE LED LAMP SYSTEM

(75) Inventors: Josef Andreas Schug, Wurselen (DE); Joseph Ludovicus Antonius Maria Sormani, Knegsel (NL); Gunnar Luttgens, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 831 days.

(21) Appl. No.: 11/573,016

(22) PCT Filed: Aug. 2, 2005

(86) PCT No.: PCT/IB2005/052584
§ 371 (c)(1), (2), (4) Date: Jan. 31, 2007

(87) PCT Pub. No.: WO2006/016325
PCT Pub. Date: Feb. 16, 2006

(65) Prior Publication Data
US 2009/0009045 A1    Jan. 8, 2009

(30) Foreign Application Priority Data
Aug. 6, 2004 (EP) .................. 04103784

(51) Int. Cl.
*F21V 9/16* (2006.01)
*F21V 21/00* (2006.01)

(52) U.S. Cl. ............... 362/84; 362/231; 362/241; 362/293; 362/249.06

(58) Field of Classification Search .......... 362/237, 362/241, 249.02, 249.06, 249.14, 231, 84, 362/293, 247
See application file for complete search history.

(56) References Cited

U.S. PATENT DOCUMENTS

| | | | |
|---|---|---|---|
| 5,813,753 A | 9/1998 | Vriens et al. | |
| 6,350,041 B1 * | 2/2002 | Tarsa et al. .................. | 362/231 |
| 6,417,019 B1 | 7/2002 | Mueller et al. | |
| 7,153,015 B2 * | 12/2006 | Brukilacchio ............... | 362/555 |
| 7,431,463 B2 * | 10/2008 | Beeson et al. ................. | 353/94 |
| 2003/0026096 A1 | 2/2003 | Ellens et al. | |
| 2003/0030060 A1 | 2/2003 | Okazaki | |
| 2003/0038295 A1 | 2/2003 | Koda | |
| 2005/0007785 A1 | 1/2005 | Jorgensen | |

FOREIGN PATENT DOCUMENTS

| | | |
|---|---|---|
| WO | 9748138 A2 | 12/1997 |
| WO | 02052615 A2 | 7/2002 |
| WO | 02054502 A1 | 7/2002 |
| WO | 03056876 A2 | 7/2003 |

* cited by examiner

Primary Examiner—Thomas M Sember

(57) ABSTRACT

An LED lamp system with a plurality of LED elements is described. The system comprises a chamber (1) with a plurality of inner side wall faces and a radiation opening (4) for the emission of light. The inner side wall faces are each formed predominantly from a plurality of LED radiation surfaces (3a, 3b).

10 Claims, 3 Drawing Sheets

HIGH PERFORMANCE LED LAMP SYSTEM

Figure 1A:
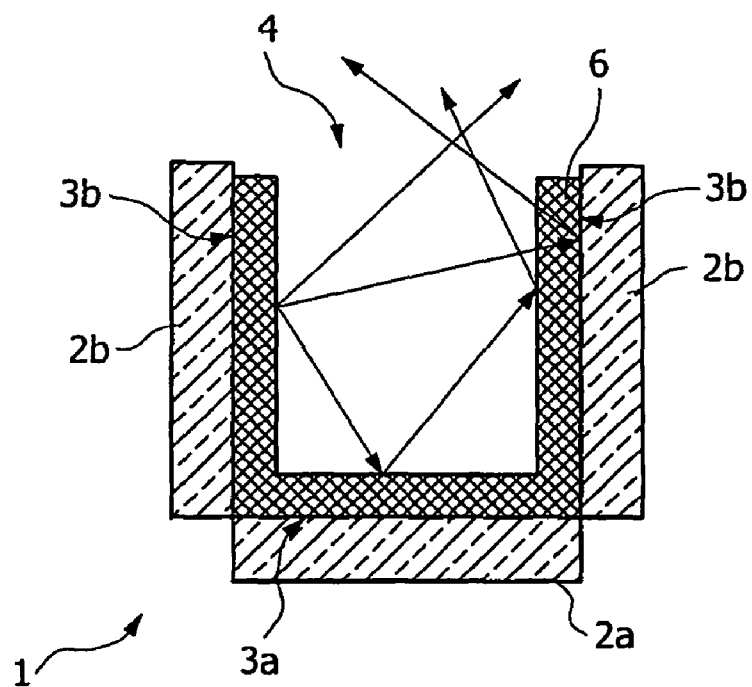

The invention relates to an LED lamp system with a plurality of LED elements.

In recent years, the technology regarding design and manufacture of inorganic solid LEDs has improved rapidly, up to a stage of development at which inorganic white light-emitting LEDs can be manufactured whose efficiency is higher than 40 lm/Watt. This efficiency distinctly exceeds that of traditional white incandescent lamps (16 lm/Watt) and of most halogen lamps (30-35 lm/Watt). The efficiency of a single LED element has grown in the meanwhile to a level substantially above 100 lm/Watt.

A problem which both now and in the future will affect the wide usability of LEDs for illumination purposes is the still relatively limited quantity of light per LED element. An increase in performance can be achieved for such LED lamp systems only if the quantity of light can be combined for a plurality of LED elements. Though this is possible in principle, it still presents problems if a light source with particularly high brightness is required, e.g. because the emitted light has to be focused in a reflector of small dimensions.

To generate white light using an LED, use is made of, inter alia, so-termed phosphor-coated LEDs (PC-LED). Such a phosphor-coated LED is an LED which has a so-termed phosphor coating over its radiation surface. Phosphor is not to be understood specifically as the chemical element phosphorus, but rather more generally as a fluorescent material, which, under the effect of radiation of a certain wavelength, emits light of another wavelength. There are fluorescent substances which radiate yellow light on irradiation by blue light. In agreement with the color of the emitted light, they are called yellow phosphors. By using such LEDs, white light is obtained by applying a yellow phosphor layer on an LED radiating blue light. Said phosphor layer is to be dimensioned such that a part of the blue light of the LED passes through the phosphor layer without hindrance and another part of the phosphor layer is converted into yellow light. The simultaneous radiation of blue and yellow light is perceived by the observer as white light. Alternatively, there are LED elements which radiate UV light and are coated with a white phosphor layer. By a suitable selection of the type and thickness of the phosphor layer, PC LEDs can be manufactured that radiate also other colors.

Using an above-described arrangement, it is possible to generate a certain quantity of light from a given radiation surface of an LED element. The current density restrictions in an LED element, however, restrict the maximum luminance of a simple PC-LED.

Several possibilities were therefore proposed in the state of the art technology to increase the luminance of LED elements. Their main aim is to focus the undirected (Lambert) radiation, emitted by an LED element, into one radiation direction. A light-emitting device comprising a UV or blue LED for use in lighting and/or display applications is mentioned, for example, in U.S. Pat. No. 5,813,753, which device is placed in a recess with reflecting side walls. The recess is filled up completely with a transparent material and it also surrounds the LED. The phosphor of such an LED element can either be dispersed in the transparent material or applied as a layer on the surface of the LED. At present, however, such LEDs do not yet reach the luminance required in light projection applications or for car headlamps.

An object of the present invention is, therefore, to provide an LED lamp system that has a higher luminance than known systems.

To achieve this object, it is proposed to provide an LED lamp system using LED elements, and having a chamber with several inner side wall surfaces and at least one radiation opening for emitting light, wherein the inner side wall surfaces are each formed by a plurality of LED radiation surfaces extending basically throughout the side wall surface area, i.e. to the maximum extent possible. It is assumed hereinbelow that the LEDs are inorganic solid bodies, because such LEDs with sufficient intensity are presently available. That notwithstanding, they can of course also be other electro-luminescent elements, e.g. laser diodes, other light emitting semi-conductors or organic LEDs, so long as they have sufficiently high performance values. The term LED is therefore to be understood in this document as a synonym for every kind of corresponding electro-luminescent elements.

The proposed arrangement achieves its high luminance because it radiates light not only from its base, but also from side faces of the chamber. The invention thus follows the principle of increasing the light radiation surface per base of the light emitting unit so as to achieve a higher luminance at the radiation opening. The light is radiated either directly at the radiation opening or reflected at a facing LED radiation surface or in a facing LED element until it is emitted through the radiation opening. The reflective finish of the rear sides of the LED elements facing the radiation surfaces makes them at least partially reflective. As a result, the luminance at the radiation opening is higher than that of usual LED elements.

The chamber may be of any shape obtainable using current manufacturing techniques. For manufacturing reasons as well as for ease of assembly, it is however advantageous if the chamber forms a geometrical body, preferably a simple one, of which a side face forms the radiation opening. In general, such geometrical bodies can advantageously be combined so as to form uniform arrangements comprising a plurality of chambers.

Flat-surface shapes are suitable from the point of view of both manufacturing and assembly. It is therefore to be preferred that the chambers be of tetrahedral, pentahedral or hexahedral shape, more preferably of parallelepiped and especially cube shape, with again a side face forming the radiation opening. Such regular flat-surface bodies can be easily combined to form arrays of a plurality of chambers.

According to an advantageous embodiment of the invention, the chamber has a cubic design and each inner side wall face is assigned to exactly one LED element. Such a cube-shaped chamber can be designed with a side face dimension of 1 mm×1 mm and used flexibly as a basic element for numerous applications and employed in multiple combinations. Such a basic element is referred to hereinbelow also as "micro-cavity".

According to an alternative embodiment of the invention, the chamber has a cuboidal shape, and the cuboid comprises longitudinal sides, one of which serves as a radiation opening, and the other longitudinal sides are each formed from a plurality of long stretched-out LED elements. Such cuboid-shaped designs of LED lamp systems are needed mainly for automotive applications. This is because due to the dimensions of the base surface of 1×4 mm, such an LED lamp system corresponds roughly to the size of a coiled filament of conventional vehicle headlamps, so that conventional optical systems can be used almost unchanged with the LED lamp system according to the invention.

Again, alternatively to the embodiments described hitherto, another embodiment can be selected in such a manner that the chamber has two side walls facing each other so as to form a V. Such a device, in which the facing V-shaped side walls are also formed from a plurality of LED elements, makes it possible to have an arrangement differing from the above-mentioned embodiments.

A sensible process step would be to apply a layer of a fluorescent substance, needed for PC-LED elements, on the LED radiation surface without damaging it. In addition, the generally temperature-sensitive fluorescent substance should be thermally decoupled from the radiation surface of the LED so that it will not be adversely affected by the heat developed during operation of the LED. It is therefore advantageous if the fluorescent substance were to be placed directly on or at a distance from the LED radiation surface. The distance can be advantageously set to achieve thermal decoupling between phosphor and LED radiation surface.

The light impression of the LED element depends on the layer thickness and the uniformity of the applied fluorescent substance. The more uniform the necessary layer thickness of the fluorescent substance, the more homogeneous the light emitted by the LED element will be. It is therefore advantageous if the fluorescent substance is provided on a carrier. This makes the manufacture of the LED independent of the application of the fluorescent substance or the manufacturing process of the LED element is not linked to the coating process with the fluorescent substance. On a separate carrier, the fluorescent substance can be applied more accurately and more uniformly in the desired layer thickness. This is favorable for the light impression of the LED element. In addition, the carrier with the fluorescent substance can be arranged at any desired location in the chamber. This can be somewhere between the LED-radiation surface and the radiation opening of the chamber.

If the light, for example blue light, radiated by an LED element impinges on the phosphor layer and is converted to yellow light there, it is also radiated in a non-directional scattered manner according to a Lambert radiation pattern. It is not possible to avoid yellow light from also being radiated back, against the desired radiation direction of the LED lamp system, towards the LED element, where it is absorbed. This causes light efficiency losses. Another advantageous embodiment of the invention therefore has a wavelength filter, preferably a dichroic filter, arranged between the LED radiation surface and the fluorescent substance. For example, this filter is permeable for radiated blue light from the LED element, but not for yellow light. Now, if blue light emerges from the LED element and enters the phosphor layer where it is incident on a fluorescent body, which converts it to yellow light and reflects it in the direction of the LED element, then, before being absorbed there, it is reflected once more by the wavelength filter and exits through the radiation opening of the chamber after penetrating the fluorescent layer. This prevents the blue radiation already converted into yellow light from being absorbed within the chamber and thus being lost as light. The wavelength filter can advantageously be used as a carrier, on which the fluorescent substance is applied as described above. This allows a particularly compact design.

Also each LED element radiates the light in a non-directional manner according to a Lambert radiation pattern. In order to already minimize the light efficiency losses thus caused in the LED element, the back of the LED element can be designed to be reflective. Almost all of the light emitted by the LED element will thus be directed towards the LED radiation surface.

The above-mentioned exemplary embodiments relate exclusively to blue LED elements. The LED lamp system according to the invention can obviously also be developed further to the point that LED elements of different wavelength characteristics are used. For example in the chamber of the lamp system of the invention, so-termed RGB LEDs can thus be used for generating white light or homochromatic LED elements can be used for generating any desired monochromatic light. Furthermore, various combinations of LED emission spectra can be thought of, e.g. blue or UV, with different fluorescent layers. Broadband yellow fluorescent material (YAG) in combination with blue LED elements can thus be used for generating white light, or UV-LED elements can be combined with red, green and blue fluorescent material for generating white, yellow-brown or amber colored light or with red fluorescent material which is excited by blue LED elements.

As already explained hereinabove, an LED element is a Lambert radiator, which emits non-directional, scattered light. As a result, not all the radiated light from the LED element necessarily reaches the radiation surface. The radiation not emitted in the direction of the radiation surface is predominantly absorbed and is thus lost. More losses can occur if a wavelength filter is used. If the emitted radiation impinges on the filter at an unfavorable angle, namely an angle distinctly greater or smaller than 90°, it cannot penetrate it and is also lost. Since the radiation emitted by the LED element does not travel exclusively via the shortest perpendicular path to a filter, but rather is scattered and impinges on the filter at different angles, losses are unavoidable. Thus, it could possibly be advantageous if a collimator is placed between an LED element and the fluorescent substance or an upstream wavelength filter. This measure takes into account the Lambert radiation characteristics of an LED element: The collimator focuses the diffuse radiation emitted by the LED element, so almost no radiation is lost. Consequently, the radiation incident on the fluorescent substance and especially on the filter is directed radiation. The collimator captures so to say the scattered radiation and conducts it to the fluorescent substance and the filter, as a result of which the light efficiency of the respective LED element is increased. The collimator itself can be connected either directly to the LED element or to the above-mentioned carrier.

The introduction of the light radiated by the LED element into the fluorescent substance again creates non-directional Lambert radiation in the fluorescent substance even in spite of the prior collimation of the introduced light. This radiation characteristic also occurs at the radiation opening of the chamber. According to another advantageous embodiment of the invention, a collimating element is provided at the radiation opening. The collimating element in turn can comprise a further collimator and/or a lens, which allows directional introduction of the radiation into a secondary optics.

A loss in light efficiency of an LED element can be caused in the LED element itself, if the generated light cannot leave the LED body in the first place, because it is totally reflected at the body edges of the LED element due to the unfavorable index of refraction from thick material to thin material. A further, advantageous development of the invention therefore proposes a substantially transparent material between the radiation surface and the fluorescent substance, which reduces or adjusts the difference between the index of refraction of the LED element and the index of refraction of the layer of the fluorescent material. Such an optical cement can be formed from silicone and makes it possible to completely couple out the light generated in the LED element. Moreover, the edges of the transparent material can be made reflective to increase the efficiency.

In another advantageous embodiment of the invention, the fluorescent material is contained or dispersed in the transparent material, which allows a more compact design of the chamber. It is also advantageous if the transparent material fills up the chamber or the collimator, at least partially. The transparent material thus lends more stability to the chamber.

The LED lamp system according to the invention is suitable not only for arrangements in which fluorescent material is excited by radiation from an LED element. Rather, also LED elements that already radiate light in the desired color can be used in the described LED lamp system. To create a more pleasant light impression for the observer, however, it may be desirable that the light radiated from the LED is scattered. Another advantageous embodiment of the invention therefore proposes a highly transparent, non-luminescent powder for the dispersion of light radiated by the LED, instead of the fluorescent material described earlier. In the case of LED elements which can do without fluorescent material, e.g. AlInGaP-elements for red or amber colored light or in the case of mere InGaN-LED-elements, the highly transparent, non-luminescent powder, such as $TiO_2$, provides the scatter effect of the—in this case—superfluous fluorescent substance and hence a more homogenous light impression.

There are advantageous applications for the LED lamp system according to the invention in every type of directional lighting. This includes vehicle headlamps, projection TV, large image screens or spot illumination.

Figure 2:
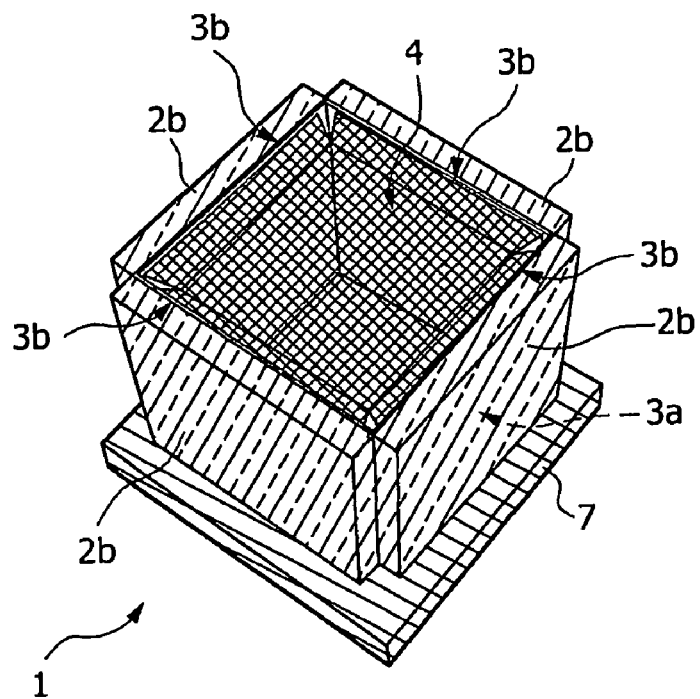
Figure 3:
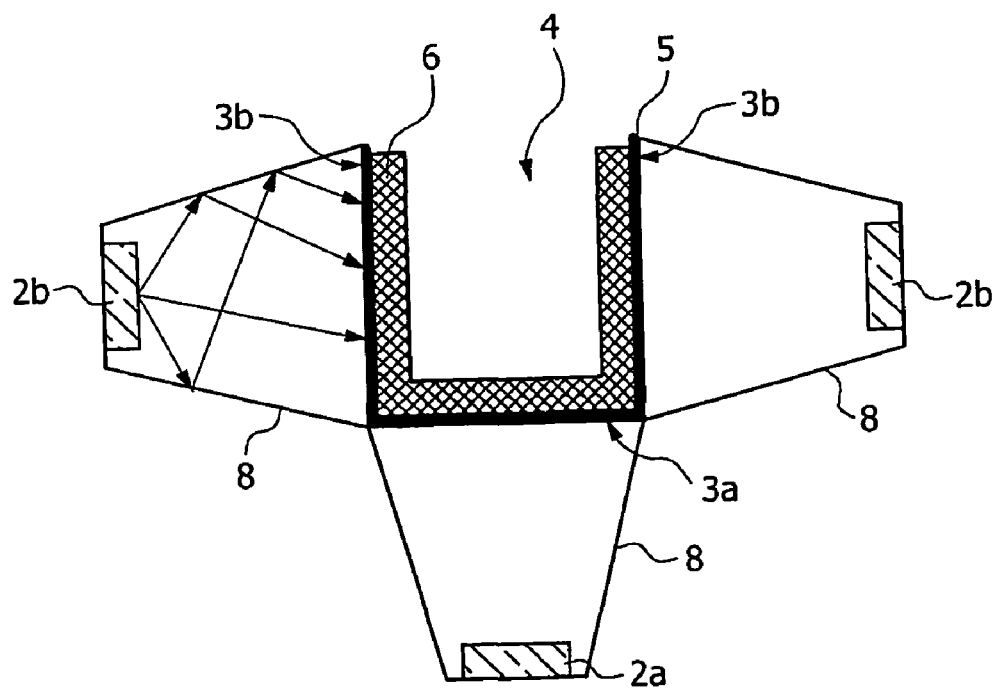
Figure 4:
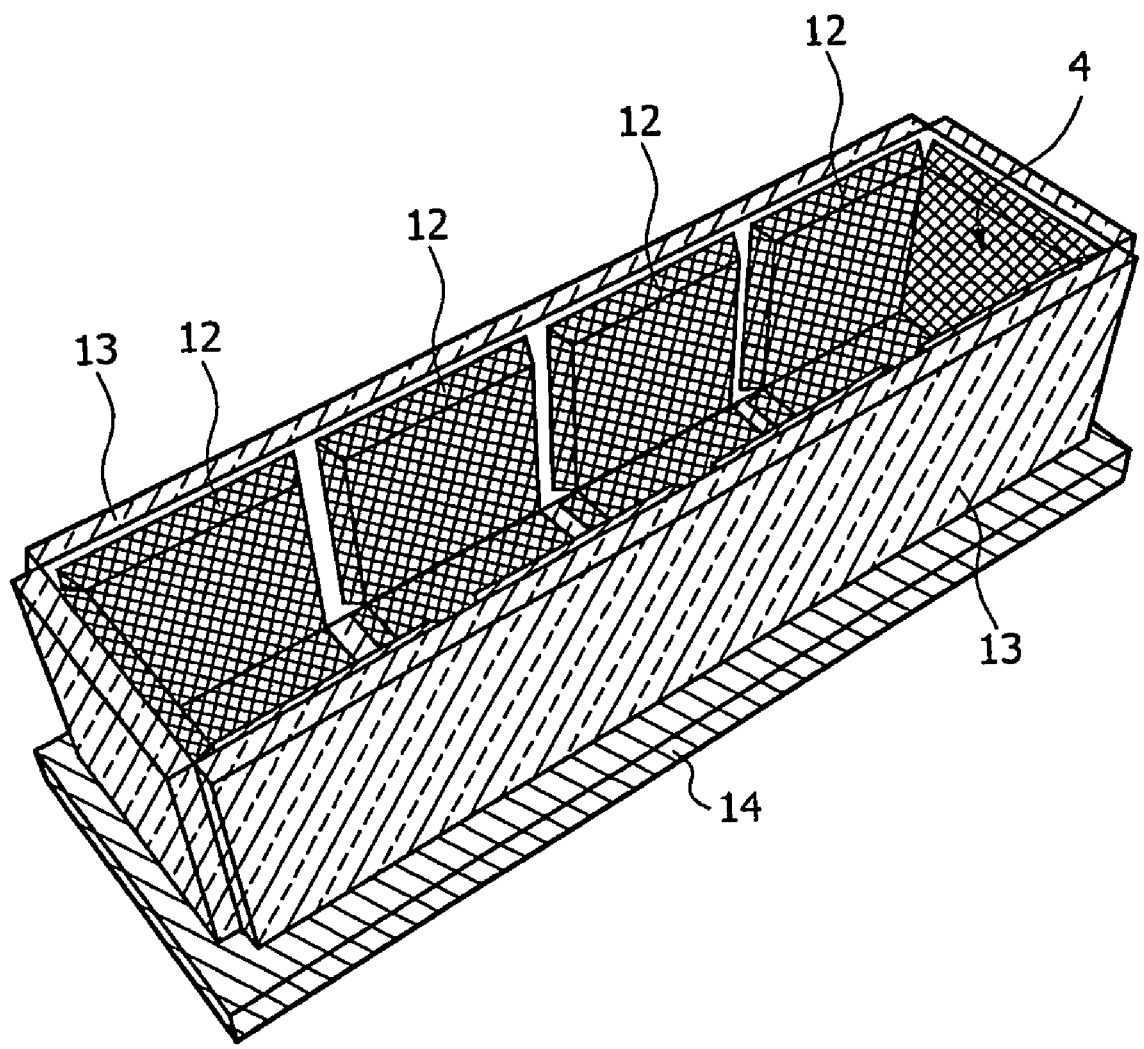

These and other aspects of the invention are apparent from and will be elucidated in greater detail, by way of non-limitative example, with reference to the embodiment(s) described hereinafter. In the drawings, FIG. 1 is a sectional view of a micro-cavity, FIG. 2 is a perspective view of a micro-cavity as shown in FIG. 1, FIG. 3 is a sectional view of an alternative micro-cavity with collimators, FIG. 4 is a perspective view of a cavity with a rectangular layout.

The principle on which micro-cavities are based is illustrated in FIG. 1a in a particularly simple embodiment by means of an example of a cubic chamber 1. The sectional view of a chamber 1 as invented is formed by three LED elements, 2a, 2b. Their radiating surfaces 3a, 3b form inner side wall surfaces of the chamber 1. A fluorescent layer 6 is applied on the radiation surfaces 3a, 3b. One side of the chamber 1 serves as a radiation opening 4.

Light radiated by one of the LED elements 2a, 2b enters the fluorescent layer 6 directly. From there, it leaves the chamber 1 through the radiation opening 4, possibly after one or more reflections.

In the chamber 1, light is thus not radiated by only one LED element but, on the same surface area as in the earlier designs, from the LED element 2a as well as from the LED elements 2b arranged at right angles thereto. The primary result of this is that the non-directionally emitted radiation from the LED element 2a, i.e. the part thereof that does not directly pass through a radiation opening 4, is reflected at least partly by the laterally placed LED elements 2b or the fluorescent substance 6 provided thereon and is finally emitted through the radiation opening 4. The lateral LED elements 2b and the fluorescent substance 6 assigned to them virtually work as a collimator of the radiated light in the direction of the radiation opening 4.

Moreover, the LED elements 2b also radiate light themselves. This light is also radiated non-directionally and therefore a certain part directly reaches the radiation opening 4 of the chamber 1. The remaining part is reflected at the opposite fluorescent layer 6 or at the LED element 2b or at the corresponding components of the LED element 2a. Thus, besides the collimating effect for the light radiated by the LED element 2a, the light generated by the laterally placed LED elements 2b passes through the radiation opening 4. This results in a luminance at the radiation opening 4 of the chamber 1 that is many times over that of a conventional LED with the same surface area.

Figure 1B:
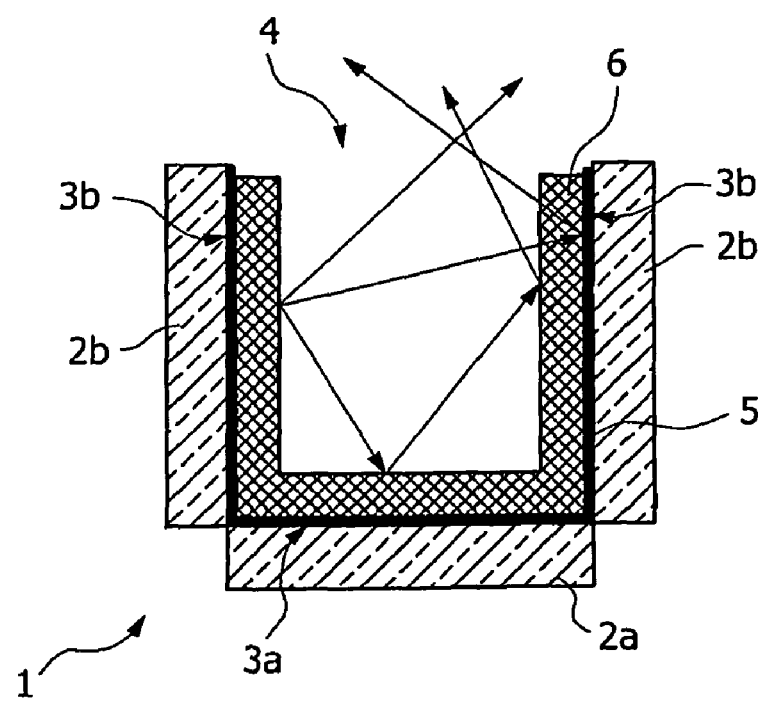

FIG. 1b shows a further development of the cubic chamber 1 shown in FIG. 1a. A dichroic filter 5 is arranged between each LED element 2a, 2b and the fluorescent layer 6. It is arranged directly on the radiation surfaces 3a, 3b. The filter 5 is designed to be semi-reflective and reflects only yellow light and is permeable to blue light. The yellow light is thus reflected directly in order to be radiated out of the chamber 1 as quickly as possible. This prevents the yellow light from being absorbed within the chamber 1 and hence from being lost as light yield of the chamber 1. Alternatively, and for the same purpose, a filter can be used which only passes light traveling from the LED element 2a, 2b into the fluorescent layer 6, whereas light traveling in the opposite direction in a broad frequency range comprising blue and yellow, is not passed, but reflected.

FIG. 2 shows a chamber 1 as shown in FIG. 1 in a perspective view. Supplementary to the sectional view in FIG. 1, a base plate 7 is discernible here on which the LED element 2a, not visible in this view, is arranged and which serves as a carrier as well as a heat sink for the LED element 2a. Corresponding base plates are also to be provided for the other LED elements 2b, but have been left out here for the sake of clarity in the illustration.

The view in FIG. 2 is a perspective view of the chamber 1 taken approximately from the direction of the radiation opening 4. It clearly shows that five radiation surfaces 3a, 3b now meet on a surface area of a conventional LED of, for example, 1 mm×1 mm, instead of one radiation surface of this size. Though they do not necessarily generate five times the quantity of light at the radiation opening 4, they do generate a multiple of the quantity of light generated in the current state of the art.

A reason for light efficiency losses in LED elements is their Lambert radiation characteristic. As a rule, only that light radiation will be exploited which is emitted more or less perpendicularly to the plane of the LED element. The remaining radiation, which is radiated non-directionally in other directions, is mostly lost as a result of absorption. Other losses occur at the filter 5, if the radiation emitted by the LED element 2a, 2b is incident on the filter 5 at a disadvantageous angle. FIG. 3 shows an embodiment in which, for this reason, one collimator 8 is arranged directly at each LED element 2a, 2b, which collimator focuses the radiation emitted by the LED element 2a, 2b in the direction of the radiation surfaces 3a, 3b. The collimator 8 does not only lead almost the entire quantity of generated light to the radiation surface, but also directs the radiation in such a manner that it passes through the filter 5 almost completely.

The principle of the chamber 1 serving as a micro-cavity can be varied as desired. An example of such a variant is shown in FIG. 4. As compared to the chamber 1, the chamber 10 of this Figure extends about four times as far in the transverse direction. As a result, the radiation opening 4 has a surface area of 1 mm×4 mm. To illustrate this length ratio, the fluorescent layer is sub-divided into four interspaced sections 12, which can however also be configured as a continuous layer. Conversely, the LED elements 13, which form the long sides of the chamber 10 and are shown as a single piece, can also be composed of four individual LED elements. Like in FIG. 2, a base plate 14 is shown by way of example, on which one LED element is arranged (not visible in the Figure) and which, in principle, is also arranged for all other LED elements.

The chamber 10 with the radiation opening 4 having dimensions of 1 mm×4 mm, corresponds to about the size of a coiled filament of a conventional lamp device of a vehicle headlamp. The chamber 10 can therefore be advantageously used in conventional optical systems, without the latter having to be adjusted at least in respect of their dimensions.

Summarizing, it is pointed out once more that these systems and methods, illustrated in the Figures and the description, are only examples of embodiments, which can be modified to a large extent by a person skilled in the art, without leaving the framework of the invention. Moreover, it is pointed out for the sake of completeness, that the use of the indefinite article "a" or "an" does not exclude the presence of a plurality of the relevant items.

The invention claimed is:

1. An LED lamp system with a plurality of LED elements, comprising:
    a chamber with a plurality of opposing inner side wall faces and,
    an LED element at a substantially right angle of said inner side wall faces and opposing a radiation opening for emitting light from the chamber,
    wherein the opposing inner side wall faces are formed by a plurality of side wall LED elements
    wherein a fluorescent substance is provided directly on or at a distance before one of the LED elements; and,
    further wherein a collimator is arranged between one of the LED elements and the fluorescent substance.

2. The LED-lamp system as claimed in claim 1, wherein the chamber is geometrical body, a side face of which forms the radiation opening.

3. The LED-lamp system as claims in claim 2, the chamber is of tetrahedral, pentahedral or hexahedral shape, with a side face of the chamber forming the radiation opening.

4. The LED-lamp system as claimed in claim 3, wherein the chamber has a cubic design and each inner side wall face is assigned to exactly one of said plurality of side wall LED elements.

5. The LED lamp system as claimed in claim 3, wherein the chamber has cuboidal shape, and the cuboid comprises longitudinal sides, one of which serves as a radiation opening and said side wall LED elements formed from a single long stretched-out LED element.

6. The LED lamp system as claimed in claim 3, wherein the chamber has two mutually facing side walls, which are arranged in a V pattern with respect to each other.

7. The LED lamp system as claimed in claim 1, wherein the LED elements are of different wavelength characteristics.

8. The LED lamp system as claimed in claim 1, wherein a highly transparent non-luminescent powder is arranged for dispersion of the light radiated by at least one of the LED elements.

9. An LED lamp system with a plurality of LED elements, comprising:
    a chamber with a plurality of opposing inner side wall faces and,
    an LED element at a substantially right angle of said inner side wall faces and opposing a radiation opening for emitting light from the chamber,
    wherein the opposing inner side wall faces are formed by a plurality of side wall LED elements
    wherein a fluorescent substance is provided on a carrier placed over one of the LED elements
    and further wherein a dichroic filter is arranged between the LED element and the fluorescent substance.

10. An LED lamp system with a plurality of LED elements, comprising:
    an illumination chamber with opposing inner side wall faces;
    an LED element at a substantially right angle of said inner side wall faces and opposing a radiation opening for emitting light from said chamber and having a fluorescent substance provided directly on or at a distance before one of the LED elements and a collimator is positioned between one of the LED elements and said fluorescent substance;
    wherein each of said inner side wall faces and said LED element are at a substantially right angle of said inner side wall faces having a radiation surface;
    wherein said opposing inner side wall faces are each formed from a side wall LED element;
    said LED element at a substantially right angle of said inner side wall faces including non-directionally emitted radiation not passing directly through said radiation opening being at least partially reflected said plurality of side wall LED elements.

* * * * *